United States Patent [19]

Kawamoto

[11] Patent Number: 5,468,686
[45] Date of Patent: Nov. 21, 1995

[54] METHOD OF CLEANING AN ETCHING CHAMBER OF A DRY ETCHING SYSTEM

[75] Inventor: Hiedaki Kawamoto, Tokyo, Japan

[73] Assignee: NEC Corporation, Tokyo, Japan

[21] Appl. No.: 351,074

[22] Filed: Nov. 30, 1994

[30]  Foreign Application Priority Data

Dec. 1, 1993 [JP] Japan .................... 5-301373

[51] Int. Cl.$^6$ ............................................. H01L 21/312
[52] U.S. Cl. ................. 437/229; 156/643.7; 156/634.1; 156/646.1; 216/66; 216/67; 437/926
[58] Field of Search ............................. 156/643.1, 646.1, 156/656.1, 634.1; 216/66, 67; 437/229, 926

[56]  References Cited

U.S. PATENT DOCUMENTS

| | | | |
|---|---|---|---|
| 4,442,338 | 4/1984 | Yamazaki | 216/67 |
| 4,985,113 | 1/1991 | Fujimoto et al. | 156/643.1 |
| 5,110,394 | 5/1992 | Ogawa | 216/66 |
| 5,127,987 | 7/1992 | Okudaira et al. | 156/646.1 |
| 5,269,878 | 12/1993 | Page et al. | 216/67 |
| 5,269,881 | 12/1993 | Sekiya et al. | 216/67 |
| 5,380,397 | 1/1995 | Fukuyama et al. | 216/67 |
| 5,397,432 | 3/1995 | Konno et al. | 156/643.1 |
| 5,399,236 | 3/1995 | Ha et al. | 437/229 |

*Primary Examiner*—Brian E. Hearn
*Assistant Examiner*—Trung Dang
*Attorney, Agent, or Firm*—Foley & Lardner

[57]  ABSTRACT

In a dry etching system, a method of cleaning an etching chamber allows a series of steps of introducing a wafer, selectively dry-etching an aluminum film provided on the wafer, cleaning the etching chamber by etching gas containing oxygen gas and capable of removing remaining chlorine, and ashing resist to be executed continuously with each of consecutive wafers without exposing them to the atmosphere. The etching and cleaning steps are completed within a period of time necessary for the ashing step. This not only protects the resulting aluminum wirings on the wafers from corrosion but also saves time otherwise consumed by the cleaning step, thereby increasing the throughput of the system.

3 Claims, 1 Drawing Sheet

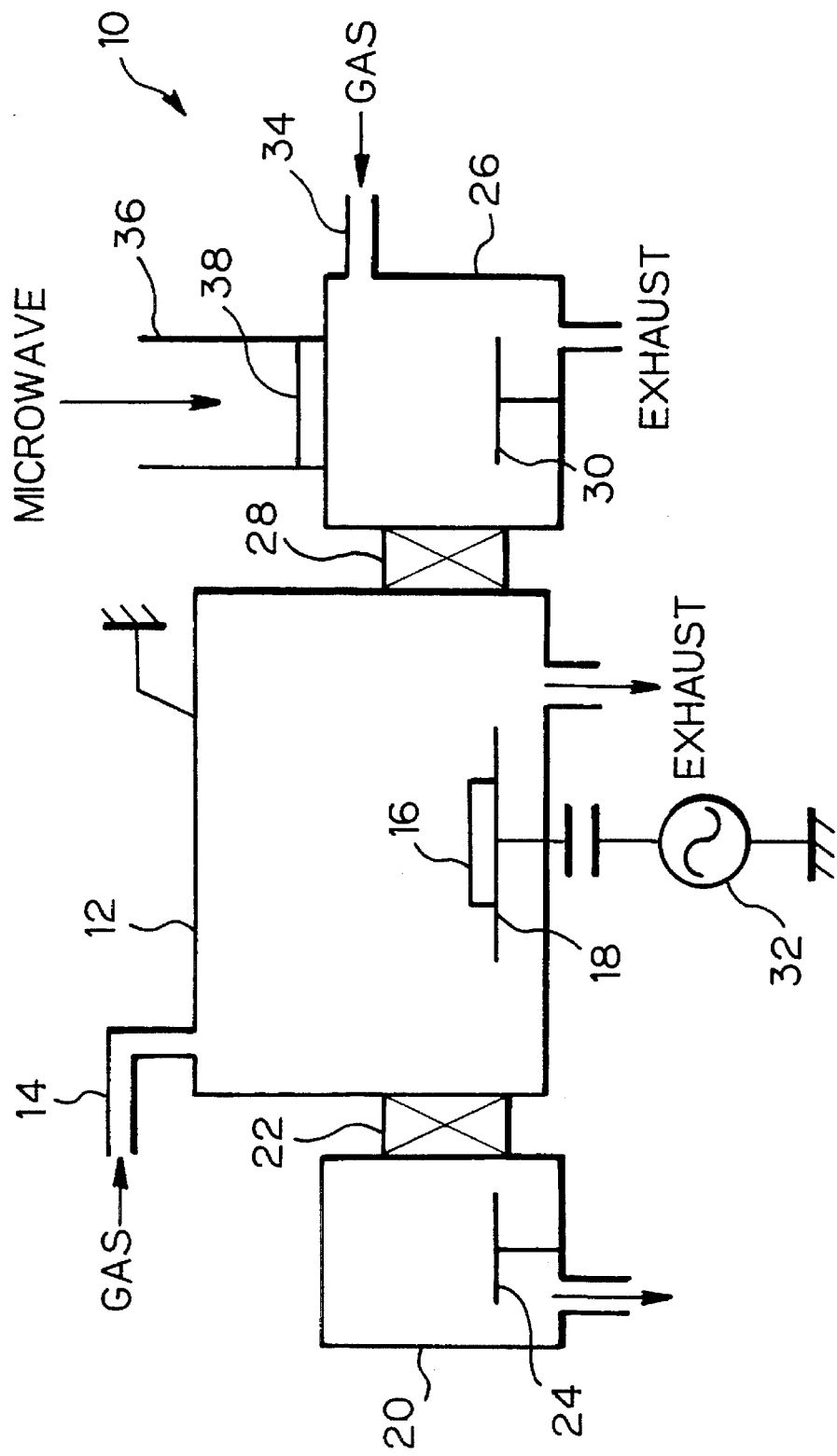

METHOD OF CLEANING AN ETCHING CHAMBER OF A DRY ETCHING SYSTEM

BACKGROUND OF THE INVENTION

The present invention relates to a dry etching system for effecting dry etching with a semiconductor substrate having an aluminum film and a resist film provided on the aluminum film in a desired pattern so as to form an aluminum wiring and, more particularly, to a method of cleaning an etching chamber included in such a dry etching system.

A dry etching system etches an aluminum film or an aluminum alloy film masked by resist so as to form a wiring. It has been customary with the dry etching system to sequentially introduce semiconductor substrates, or wafers, into an etching chamber one by one. The problem with such a single wafer type dry etching system is that as the etching operation is repeated, products whose major component is the resist sequentially accumulate on the walls of the etching chamber. The products deposited on the walls of the etching chamber again evaporate and change the atmosphere in the chamber and discharge impedance, thereby critically lowering the reproductivity of the etching degree. For example, in a dry etching system having an etching end point detector, light issuing at the time of etching is prevented from being fully transmitted through a quartz window due to the products, preventing the detector from detecting the end of etching with accuracy.

In light of the above, it is a common practice to clean the etching chamber. In the single wafer type dry etching system, every time a hundred wafers are treated, oxygen gas is introduced into the etching chamber to generate plasma. The plasma effects dry etching in the etching chamber and thereby cleans the chamber. A cleaning method which cleans the etching chamber every time a single wafer is treated is also known in the art and distinguished from such a periodic cleaning method. The wafer-by-wafer cleaning method, directed toward a shorter cleaning time, is effected with a wafer left in the etching chamber or removed therefrom, depending on how the wafer is affixed to a stage.

However, both the periodic cleaning method and the wafer-by-wafer cleaning method need the same period of time in total, or the latter consumes a longer period of time than the latter. This reduces the throughput of the dry etching system. Further, assume that the wafer-by-wafer cleaning method is effected with a wafer left in the etching chamber. Then, even if treatment against aluminum corrosion is performed during the following plasma ashing, chlorine remains so long as the cleaning gas is implemented only by oxygen gas. As a result, when the wafer is exposed to the atmosphere afterwards, the remaining chlorine and moisture are coupled to turn out aluminum chloride. This causes corrosion to occur and degrades the reliability of wiring to a critical degree.

SUMMARY OF THE INVENTION

It is, therefore, an object of the present invention to provide a method capable of cleaning the etching chamber of a dry etching system in an extremely short period of time without causing an aluminum wiring to corrode, thereby enhancing the throughput of the system.

In accordance with the present invention, in a a dry etching system having an etching chamber in which a single semiconductor substrate is disposed and .etched, and at least one auxiliary chamber communicated to the etching chamber via a gate valve and capable of accommodating the substrate, a method of cleaning the etching chamber has the steps of introducing halogen gas into the etching chamber to etch a single semiconductor substrate by plasma, the semiconductor substrate having an aluminum film and a resist film provided on the aluminum film in a desired pattern, replacing, while leaving the substrate in said etching chamber, the halogen gas with cleaning gas containing oxygen gas and capable of removing remaining chlorine to thereby generate plasma, and effecting dry etching in the etching chamber.

BRIEF DESCRIPTION OF THE DRAWINGS

The above and other objects, features and advantages of the present invention will become more apparent from the following detailed description taken with the accompanying drawing in which:

A FIG. 1 shows a dry etching system with which a cleaning method embodying the present invention is practicable.

DESCRIPTION OF THE PREFERRED EMBODIMENT

Referring to FIG. 1, a dry etching system is shown to which a cleaning method embodying the present invention is applicable. As shown, the system, generally 10, has an etching chamber 12 formed with a gas inlet 14. In the etching chamber 12, a wafer 16 is affixed to a stage 18. Etching gas is admitted into the chamber 12 to generate plasma, thereby etching the wafer 16. A sample chamber 20 is communicated to the etching chamber 12 via a gate valve 22 and has a stage 24 thereinside. An ashing chamber 26 is also communicated to the etching chamber 12 via a gate valve 28 and has a stage 30 thereinside. In the ashing chamber 26, resist is removed from the wafer 16 etched in the etching chamber 12. The system 10 having such a configuration etches a single wafer at a time in a continuous procedure. Specifically, after a wafer has been set on the stage 24 of the sample chamber 20, the gate valve 22 is opened to transfer the wafer from the sample chamber 20 to the etching chamber 12. After the wafer has been etched in the etching chamber 12, the gate valve 28 is opened to introduce it into the ashing chamber 26. In the ashing chamber 26, resist remaining on the waster is removed by ECR (Electron Cyclotron Resonance) plasma ashing.

The cleaning method in accordance with the present invention will be described along with the etching procedure of the dry etching system 10. The wafer 16 is covered with an aluminum film containing a small amount of silicon and copper. Resist is deposited on the aluminum film in a desired pattern. Such a wafer 16 is laid on the stage 24 of the sample chamber 20. Then, the sample chamber 20 is sufficiently exhausted until it has been depressurized to a predetermined pressure. Subsequently, the gate valve 22 is opened to transfer the wafer 16 from the stage 24 to the stage 18 disposed in the etching chamber 12, and then the gate valve 22 is closed. In this condition, a gaseous mixture of $BCl_3$, $Cl_2$ and $N_2$ is introduced via the gas inlet 14 into the etching chamber 12 which is held under high vacuum. While a pressure of 40 mTorr is set up in the etching chamber 12, high frequency power of 13.56 MHz is .applied from a high frequency power source 32 to between opposite electrodes so as to generate plasma. As a result, the aluminum film of the wafer 26 is selectively etched by ion due to the resist pattern or mask.

After the etching step, the etching chamber 12 is sufficiently exhausted, and then cleaning gas is admitted into the chamber via the gas inlet 14 to maintain it at a predetermined pressure. The cleaning gas is a mixture of oxygen gas having a high etching ability and gas which protects aluminum from corrosion attributable to remaining chlorine. The gas for the protection of aluminum from this kind of corrosion should preferably be ammonia gas, ethanol gas or carbon tetrafluoride gas. Particularly, as for ammonia gas, it should preferably be mixed in a ratio of 5:3 to oxygen gas. With ethanol gas, a good result is achievable when it is mixed in a ratio of 1:6 to oxygen gas. These were found by a series of experiments.

After the introduction of the cleaning gas, high frequency power of 100 W is applied from the high frequency power source 32 to generate plasma. As a result, products deposited on the stage 18, inclusive of the wafer 16, and the walls of the etching chamber 12 are removed by reactive etching. When the reactive etching was effected for 15 seconds, no chlorine was left on the wafer 16 while the walls of the chamber 12 were found as clean as in the initial state.

Subsequently, the gate valve 28 is opened to transfer the wafer 16 from the stage 18 to the stage 30 disposed in the ashing chamber 26. After the gate valve 28 has been closed, the etching chamber 12 is again exhausted to high vacuum, the gate valve 22 is opened, and then the next wafer 16 is introduced into the chamber 12. On the other hand, oxygen gas is admitted into the ashing chamber 26, in which the wafer 16 is positioned, via a gas inlet 34 to maintain the chamber 26 at a pressure of 1 Torr. Microwave of 2.45 GHz is fed into the ashing chamber 26 from a waveguide 36 via an insulation plate 38. The microwave generates plasma based on the ECR phenomenon with the result that the resist on the wafer 16 is ashed and removed.

While ashing is under way in the ashing chamber 26, the etching of the next wafer 16 and the cleaning of the etching chamber 12 are performed in the etching chamber 12. At the same time, a fresh wafer 16 is held in the sample chamber 20 under high vacuum, waiting for the transfer to the etching chamber 12.

As stated above, a single cycle consisting of the introduction, etching, cleaning and ashing of a wafer 16 is completed within the period of time necessary for ashing. Hence, such a cyclic procedure is included in the ashing time, i.e., the etching chamber 12 is fully cleaned without resorting to any extra time. As a result, three to six more wafers can be treated for an hour than in the conventional procedure, as determined by experiments.

In summary, the present invention allows a series of steps of introducing a wafer, selectively dry-etching an aluminum film provided on the wafer, cleaning an etching chamber by etching gas containing oxygen gas and capable of removing remaining chlorine, and ashing resist to be executed continuously with each of consecutive wafers without exposing them to the atmosphere. Moreover, the method of the present invention completes the etching and cleaning steps within a period of time necessary for the ashing step. This not only protects the resulting aluminum wirings on the wafers from corrosion but also saves time otherwise consumed by the cleaning step, thereby increasing the throughput of a dry etching system.

Various modifications will become possible for those skilled in the art after receiving the teachings of the present disclosure without departing from the scope thereof.

What is claimed is:

1. A method of cleaning an etching chamber of a dry etching system having said etching chamber in which a single semiconductor substrate is disposed and etched, and at least one auxiliary chamber communicated to said etching chamber via a gate valve and capable of accommodating said semiconductor substrate, said method comprising the steps of:

(a) introducing halogen gas into said etching chamber to etch a single semiconductor substrate by plasma, said semiconductor substrate having an aluminum film and a resist film provided on said aluminum film in a desired pattern;

(b) replacing, while leaving said semiconductor substrate in said etching chamber, said halogen gas with cleaning gas containing oxygen gas and capable of removing remaining chlorine to thereby generate plasma; and (c) effecting dry etching in said etching chamber.

2. A method as claimed in claim 1, further comprising:

(d) transferring said semiconductor substrate undergone etching and carrying said resist thereon to said auxiliary chamber and removing said resist by plasma ashing; and (e) effecting dry etching in said etching chamber while said plasma ashing is under way in said auxiliary chamber.

3. A method as claimed in claim 1, wherein said cleaning gas comprises ammonia gas or methanol gas.

* * * * *